United States Patent
Ng et al.

(12)

(10) Patent No.: US 6,235,636 B1
(45) Date of Patent: May 22, 2001

(54) RESIST REMOVAL BY POLISHING

(75) Inventors: Che-Hoo Ng, San Martin; Matthew S. Buynoski, Palo Alto, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/295,271

(22) Filed: Apr. 20, 1999

(51) Int. Cl.⁷ .................................................. H01L 21/302
(52) U.S. Cl. ................................. 438/692; 134/7; 134/6; 438/689; 438/690; 438/691; 438/693
(58) Field of Search .................... 438/689, 692, 438/693, 691, 690; 134/6, 7

(56) References Cited

U.S. PATENT DOCUMENTS

| | | | |
|---|---|---|---|
| 5,722,875 | * | 3/1998 | Iwashita et al. .......................... 451/8 |
| 5,763,304 | * | 6/1998 | Tseng ................... 438/239 |
| 6,001,739 | * | 12/1999 | Konishi ................ 438/692 |
| 6,117,783 | * | 9/2000 | Small et al. .......... 438/693 |
| 6,126,531 | * | 10/2000 | Iida et al. ............. 451/447 |

OTHER PUBLICATIONS

Peter Van Zant, Microchip Fabrication, A Practical Guide to Semiconductor Processing, (McGraw–Hill, Third Edition), pp. 192–197 & 272–277 & 300–302.

* cited by examiner

*Primary Examiner*—Randy Gulakowski
*Assistant Examiner*—Michael Kornakov
(74) *Attorney, Agent, or Firm*—Lariviere, Grubman & Payne, LLP

(57) ABSTRACT

Chemical mechanical polishing for removing a hardened surface layer of photoresist in the manufacture of semiconductor devices. The use of chemical mechanical polishing allows for the removal of a hardened surface layer of photoresist that has been hardened through ion beam implantation or plasma etching. The chemical mechanical polishing process places a semiconductor wafer with a photoresist layer on a polishing pad. The photoresist layer is placed close to the polishing pad, so that the hardened surface layer of the photoresist layer is removed. A slurry is added to the polishing pad to aid in the removal of the hardened surface layer of the photoresist layer. Conventional chemical stripping is then used to remove the remaining photoresist layer.

10 Claims, 6 Drawing Sheets

RESIST REMOVAL BY POLISHING

FIELD OF THE INVENTION

The present invention relates to semiconductor devices. Even more particularly, the present invention relates to semiconductor devices that use photoresist layers which are later removed.

BACKGROUND OF THE INVENTION

In the prior art, in the creation of semiconductor devices, a photoresist layer is applied to create a pattern. The photolithography process using photoresist is described in "Microchip Fabrication" by Peter Van Zant and published by McGraw-Hill, Third Edition 1997, pp 192 –197, and 273–277. A photoresist layer is spun onto a surface of a substrate and dried. A mask or reticle is placed over the photoresist layer. The photoresist layer and mask are exposed to light, which causes masked portion of the photoresist layer to remain and unmasked portions of the photoresist layer to develop soluble. The soluble parts of the photoresist layer are removed with a solvent, leaving a photoresist layer pattern. The photoresist layer pattern is used as a mask for ion bombardment or plasma etching. Ion bombardment and plasma etching of the photoresist causes a hardening of the surface of the photoresist. Chemical stripping, used in the prior art, is not able to remove all of the hardened surface of the photoresist layer. Scrubbers such as a brush and water jet, also used in the prior art, are also not able to remove the hardened surface of the photoresist layer. Plasma stripping, which is also used in the prior art, is able to remove the hardened surface of the photoresist layer, but requires a charge which may damage the semiconductor devices. The incomplete removal of the hardened surface of the photoresist layer causes the incomplete removal of the remainder of the photoresist layer, thus leaving photoresist residue such as particles of heavy metals, which may diminish the performance of transistors by causing source, drain, and gate edges, in addition to causing open circuits or shorts.

It would be advantageous to have a method of removing the photoresist layer more completely without damaging the underlying semiconductor device.

BRIEF SUMMARY OF THE INVENTION

It is an object of the invention to provide a method of more completely removing a photoresist layer without damaging the semiconductor device.

It is another object of the invention to provide a method for removing an outer hardened photoresist surface.

Accordingly, the foregoing objects are accomplished by providing a chemical mechanical polishing to a semiconductor device to remove an outer hardened photoresist layer and then chemical stripping is used to remove the remaining photoresist layer.

Other features of the present invention are disclosed or made apparent in the section entitled: "DETAILED DESCRIPTION OF THE INVENTION."

BRIEF DESCRIPTION OF DRAWINGS

For fuller understanding of the present invention, reference is made to the accompanying drawings wherein.

Figure 1:
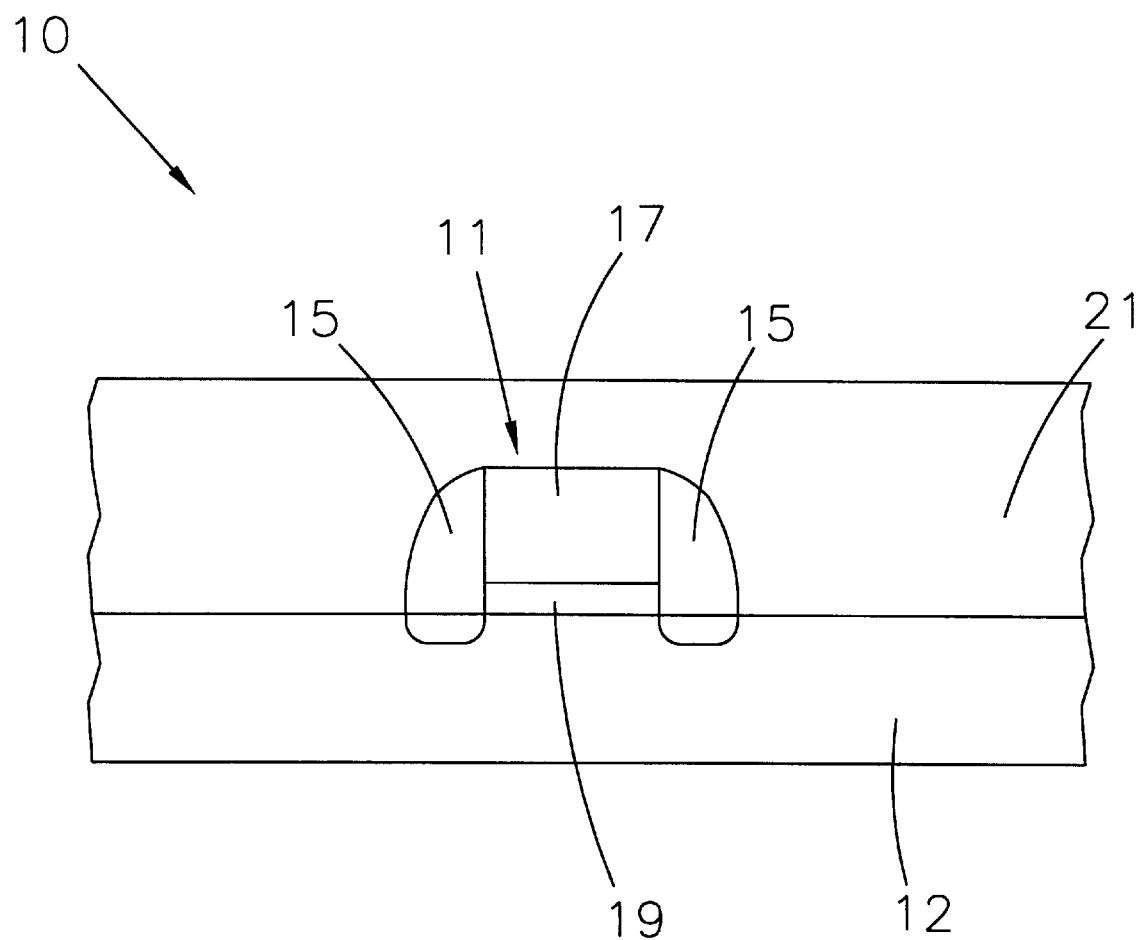
FIG. 1 is a cross sectional view of part of a semiconductor wafer with a gate and a layer of photoresist.

Reference numbers refer to the same or equivalent parts of the present invention throughout the several figures of the drawing.

DETAILED DESCRIPTION OF THE INVENTION AND BEST MODE OF THE INVENTION

FIG. 1 is a cross sectional view of part of a semiconductor wafer 10 and the first phase of a MOSFET 11 on the semiconductor wafer 10. The silicon wafer 10 forms a substrate 12 for the MOSFET 11. The first phase of the MOSFET 11 has a gate 17 placed on a gate oxide 19 formed on the surface of the substrate 12. Side spacers 15 are formed on the side of the gates 17. A photoresist layer 21 is spun onto the surface of the substrate 12.

Figure 2:
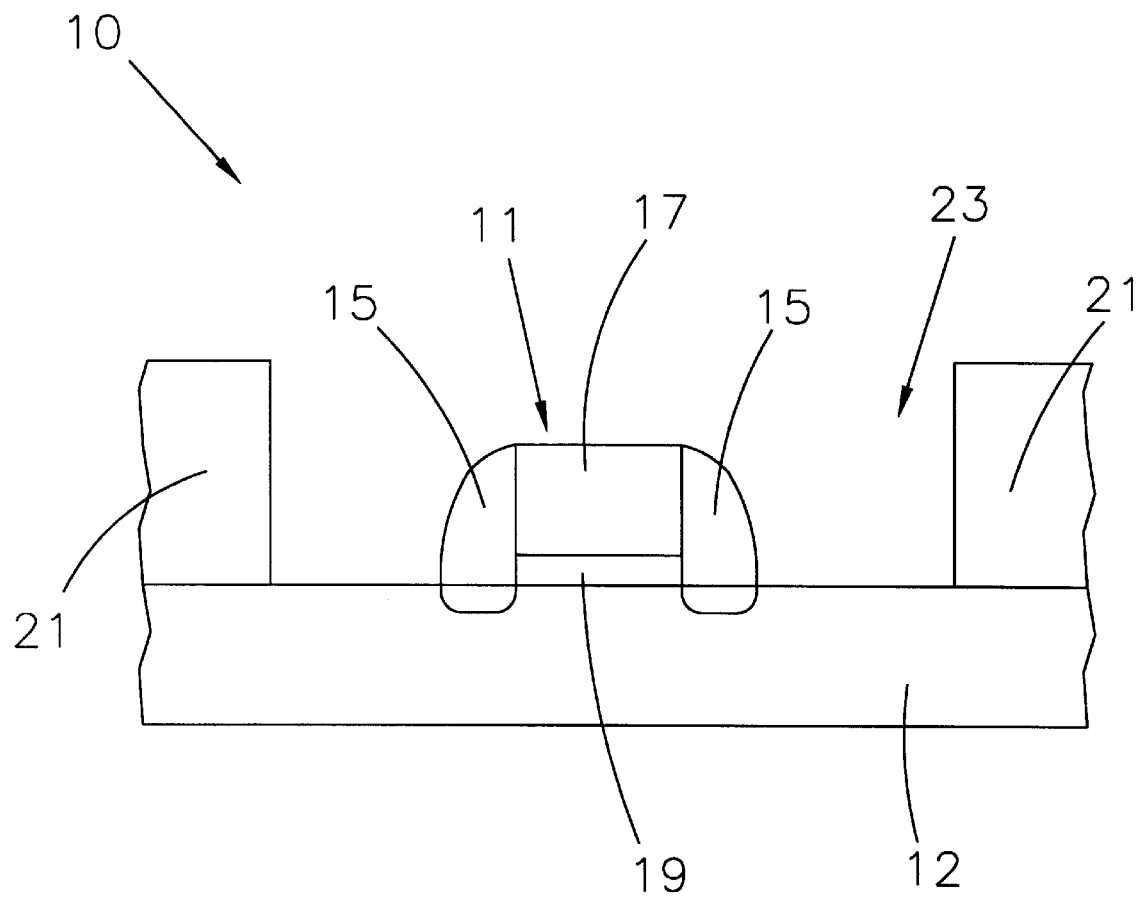
FIG. 2 is a cross sectional view of part of the semiconductor wafer with part of the layer of photoresist etched away to provide a photoresist pattern.

A mask or reticle is placed over the photoresist layer 21. The photoresist layer and mask are exposed to light, which causes masked portion of the photoresist layer to remain soluble and unmasked portions of the photoresist layer to develop. The soluble parts of the photoresist layer 21 are removed with a solvent, leaving a photoresist layer pattern with an aperture 23, as shown in FIG. 2.

Figure 3:
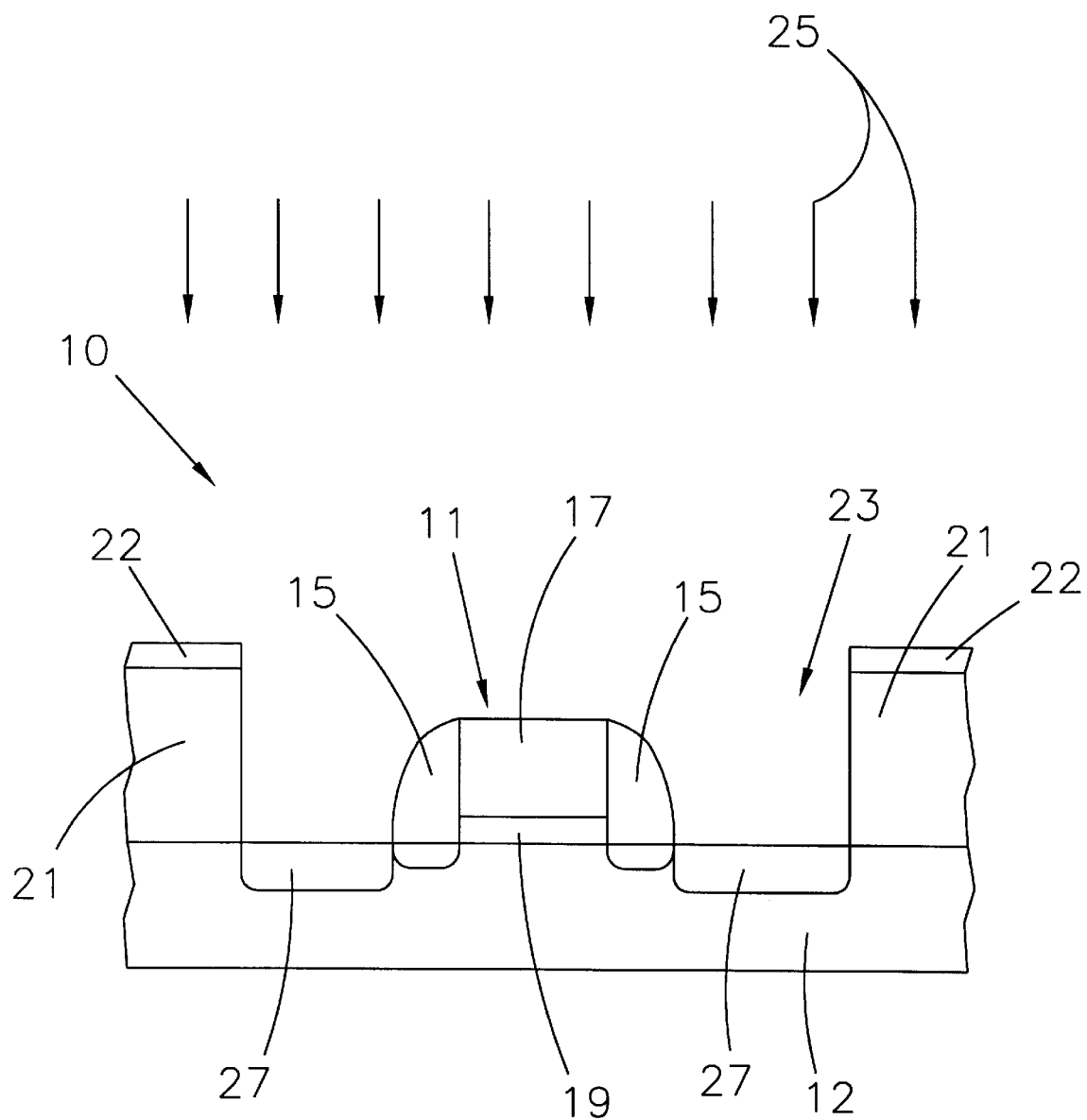
FIG. 3 is a cross sectional view of part of the semiconductor wafer undergoing ion implantation.

An ion beam 25 of a dopant ion is directed towards the surface of the silicon wafer 10, creating source/drain regions 27, and the photoresist layer 21, as shown in FIG. 3. The ion beam 25 is stopped by the photoresist layer 21, sputtering the photoresist and changing the chemical makeup of the surface of the photoresist creating a hardened surface layer of photoresist 22. At the aperture 23, the ion beam 25 is able to pass to the surface of the silicon wafer 10 creating source/drain regions 27 below the aperture 23.

The photoresist layer 21 is then stripped. Chemical stripping, used in the prior art, is not able to remove all of the hardened surface of the photoresist layer. Scrubbers such as a brush and water jet, also used in the prior art, are also not able to remove the hardened surface of the photoresist layer. Plasma stripping, which is also used in the prior art, is able to removed the hardened surface of the photoresist layer, but also causes damage to the semiconductor devices. Therefore the invention uses chemical mechanical polishing (CMP) to remove the hardened surface layer of photoresist 22.

Figure 4:
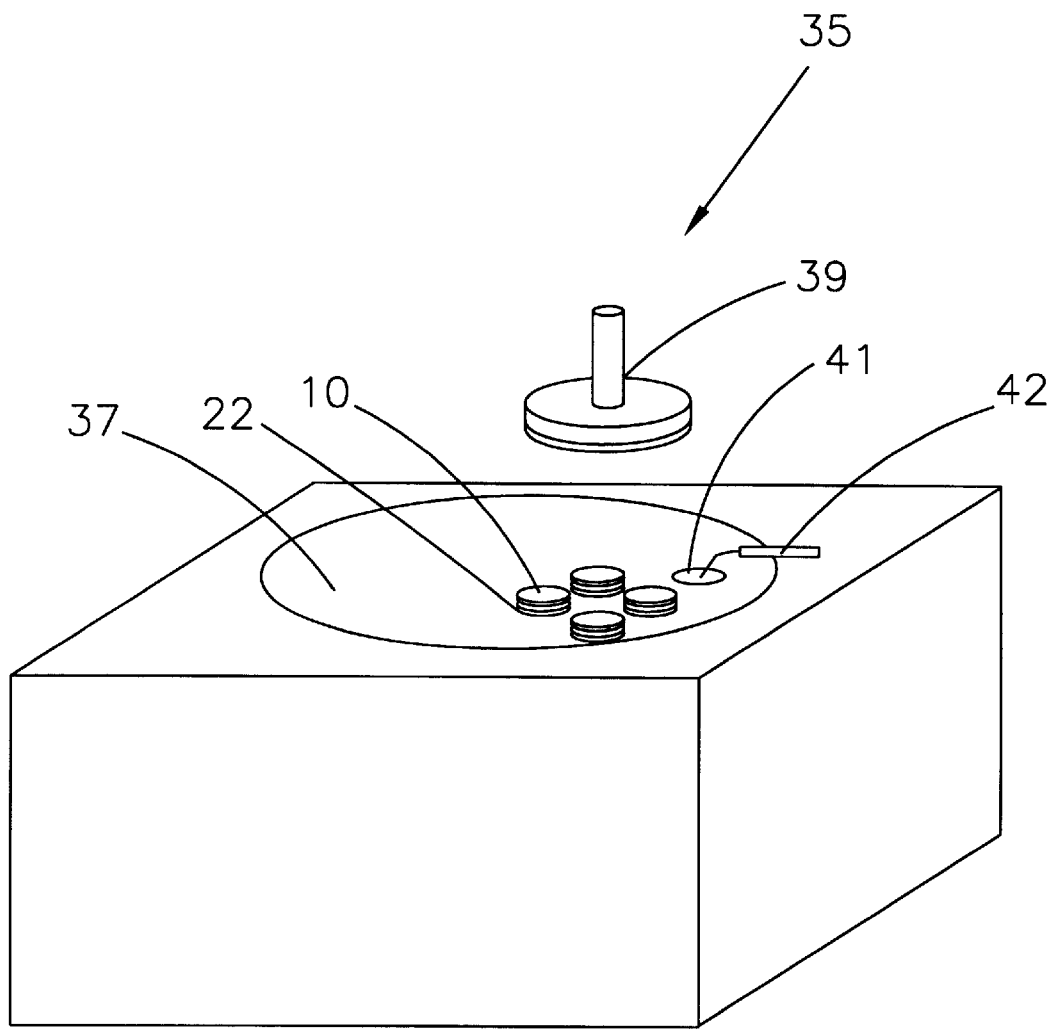
FIG. 4, is a schematic illustration the semiconductor wafer mounted in a chemical mechanical polishing (CMP) device.

FIG. 4 is a schematic illustration of the semiconductor wafer 10 mounted in a chemical mechanical polishing (CMP) device 35. The semiconductor wafer 10 is placed on a polishing pad 37 and so that the hardened surface layer of photoresist 22 is closest to the polishing pad 37 and between the polishing pad 37 and the semiconductor wafer 10. A polishing head 39 is placed over the semiconductor wafer 10, pushing the semiconductor wafer 10 into the polishing pad 37. Usually the polishing pad 37 will have a wider diameter than the polishing head 39 and the polishing head 39 is placed off center from the polishing pad 37, so that the polishing head 39 will have a planetary movement with respect to the polishing pad 37. The polishing head 39 and polishing pad 37 are rotated. In the preferred embodiment of the invention, the polishing pad 37 is a compliant material, such as polyurethane, so that the hardened surface layer of the photoresist 22 is removed, without planarizing the semiconductor wafer 10 and removing the gate 17 or other MOSFET structures or the remaining photoresist layer 21. A slurry dispenser 42 provides slurry 41 to the polishing pad 37 to allow the chemical mechanical polishing. In the preferred embodiment an aggressive slurry containing agents such as hydroxylamine $H_2NOH$ or phenol, or a less aggressive slurry containing agents such as benzene or toluene, or an acidic slurry containing agents such as sulfuric acid $H_2SO_4$, or a water only slurry may be used.

Figure 5:
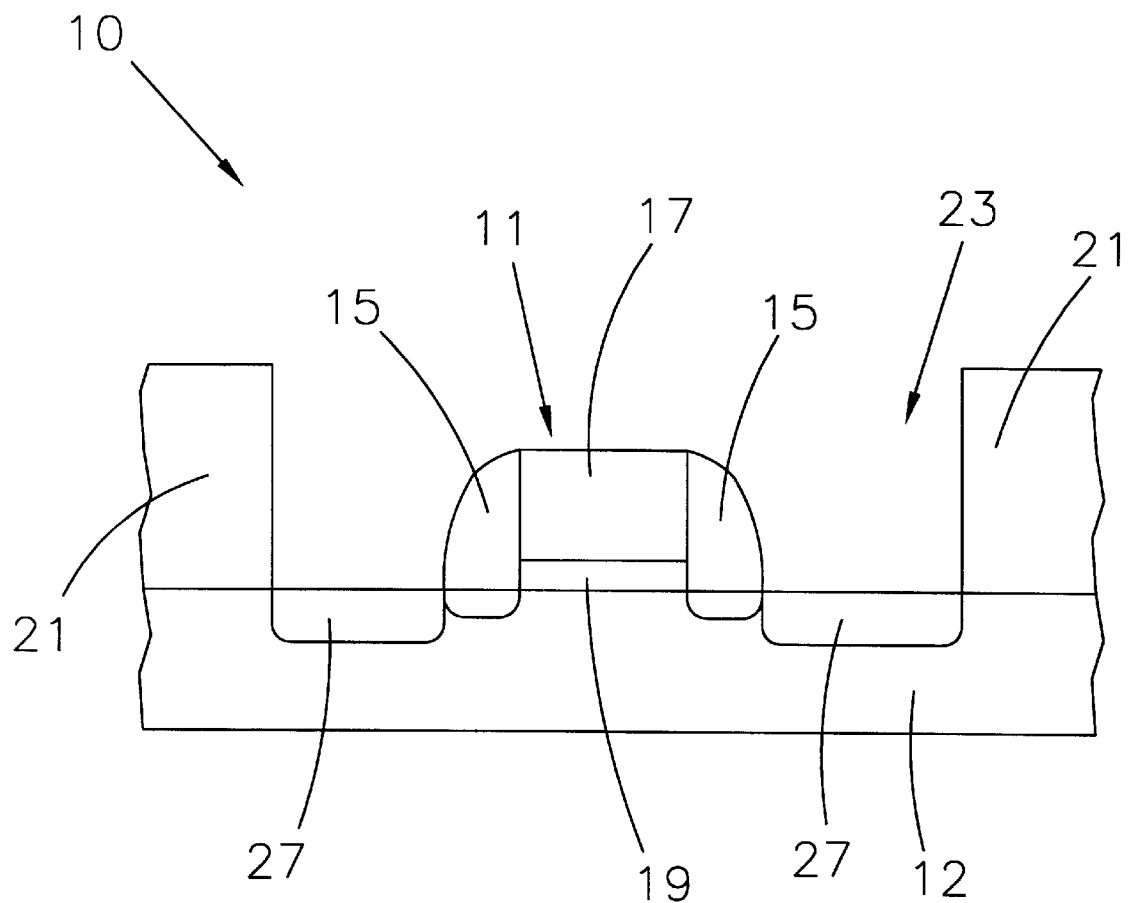
FIG. 5 is a cross sectional view of part of the semiconductor wafer after the semiconductor wafer has been removed from the chemical mechanical polishing device.
Figure 6:
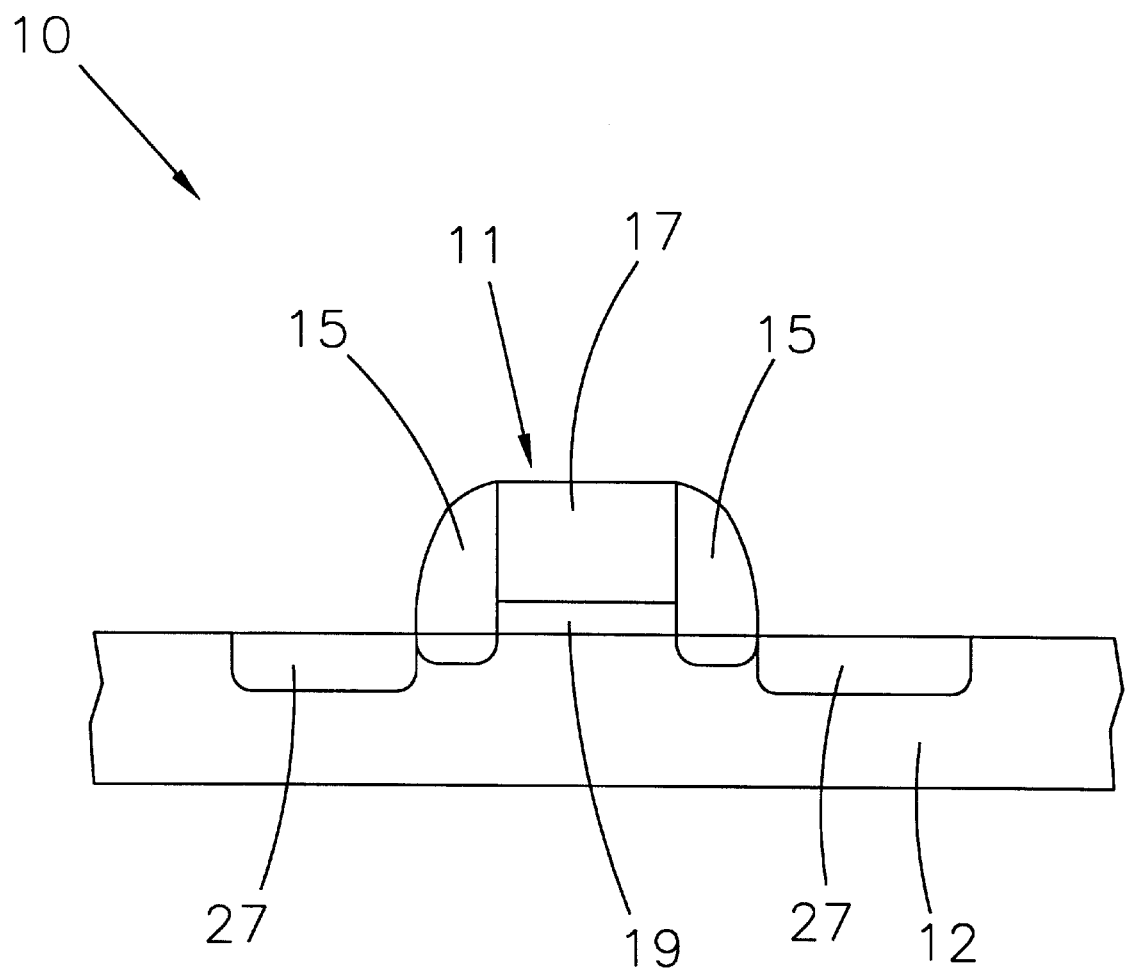
FIG. 6 is a cross sectional view of part of the semiconductor wafer, after the photoresist layer has been chemically stripped.

FIG. 5 is a cross sectional view of part of a semiconductor wafer 10 and the first MOSFET 11 on the semiconductor wafer 10 after the semiconductor wafer 10 is removed from the chemical mechanical polishing device 35. The gate 17 and side spacers 15, and some of the layer of photoresist 21 remain intact, while the chemical mechanical polishing has removed the hardened surface layer of photoresist 22. The wafer 10 is subjected to a chemical stripping to remove the remaining layer of photoresist 21. In the preferred embodiment, the chemical stripping is performed by applying liquid sulfuric acid to the remaining layer of photoresist 21, which dissolves the remaining photoresist layer 21 by an oxidation mechanism, resulting in a semiconductor wafer 10 with the first MOSFET 11, as shown in FIG. 6.

In other embodiments, other processes are used for the step of hardening the surface layer of the photoresist, instead of by ion beam bombardment, such as plasma etching. These other processes provide a hardened surface layer of the photoresist, which is difficult to completely remove by chemical stripping other types of chemical stripping may be used in these other embodiments.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is specifically disclosed herein.

We claim:

1. A method of using photoresist on a semiconductor wafer comprising the steps of:

forming at least one gate on a semiconductor wafer;

applying a photoresist layer on the at least one gate and the semiconductor wafer, wherein the photoresist layer completely covers at least one gate and the semiconductor wafer;

applying a processing step selected from a group consisting essentially of:

projecting an ion beam onto the photoresist layer and onto the semiconductor wafer, thereby hardening a surface layer of the photoresist layer, and thereby forming a hardened photoresist surface layer, and subjecting the photoresist layer to plasma etching, thereby hardening a surface layer of the photoresist layer, and thereby forming a hardened photoresist surface layer; and removing the hardened photoresist surface layer by chemical mechanical polishing such that at least one gate and the semiconductor wafer are not planarized.

2. The method, as recited in claim 1, wherein the step of removing the hardened photoresist surface layer leaves a residual portion of the photoresist layer.

3. The method, as recited in claim 2, further comprising the step of chemically stripping the residual portion of the photoresist layer using a chemical stripping material.

4. The method, as recited in claim 3, wherein the step of applying a chemical mechanical polishing comprises the steps of:

placing the semiconductor wafer in a chemical mechanical polishing device; and placing a slurry in the chemical mechanical polishing device; and operating the chemical mechanical polishing device.

5. The method, as recited in claim 4, wherein the step of placing the semiconductor wafer in the chemical mechanical polishing device comprises the steps of:

placing the semiconductor wafer on a polishing pad, and placing the hardened photoresist surface layer against the polishing pad.

6. The method, as recited in claim 5, wherein the polishing pad comprises polyurethane.

7. The method, as recited in claim 6, wherein the slurry comprises a chemical mechanical polishing solvent selected from a group consisting essentially of hydroxylamine ($NH_2OH$), phenol ($C_6H_5OH$), benzene ($C_6H_6$), toluene ($C_6H_5CH_3$), water ($H2O$), and sulfuric acid ($H_2SO_4$).

8. The method, as recited in claim 1, after the step of applying the photoresist layer and before the step of applying the processing step, further comprising the steps of:

masking the photoresist layer with a patterned mask, thereby forming at least one masked portion and at least one unmasked portion of the photoresist layer;

exposing the patterned mask and the photoresist layer to light, thereby forming at least one developed photoresist portion from at least one unmasked portion, and thereby forming at least one undeveloped photoresist portion from at least one masked portion; and removing the patterned mask; and dissolving the at least one undeveloped portion wherein the remaining developed portion forms a photoresist layer pattern having at least one aperture.

9. The method, as recited in claim 2, after the step of applying the photoresist layer and before the step of applying the processing step, further comprising the steps of:

masking the photoresist layer with a patterned mask, thereby forming at least one masked portion and at least one unmasked portion of the photoresist layer;

exposing the patterned mask and the photoresist layer to light, thereby forming at least one developed photoresist portion from at least one unmasked portion, and thereby forming at least one undeveloped photoresist portion from the at least one masked portion; and removing the patterned mask; and dissolving at least one undeveloped portion wherein the remaining developed portion forms a photoresist layer pattern having at least one aperture.

10. The method, as recited in claim 3, wherein the chemical stripping material comprises sulfuric acid ($H_2SO_4$).

* * * * *

UNITED STATES PATENT AND TRADEMARK OFFICE
CERTIFICATE OF CORRECTION

PATENT NO. : 6,235,636 B1
DATED : May 22, 2001
INVENTOR(S) : Che-Hoo Ng and Matthew S. Buynoski Page 1 of 1

It is certified that error appears in the above-identified patent and that said Letters Patent is hereby corrected as shown below:

Column 1,
Line 19 & 20, after the word "remain" add -- soluble -- and after the word "develop" delete [soluble].

Column 3,
Line 34, after the word "stripping" add -- . -- and delete [other] replace with -- Other --.
Line 6, of claim 1, after the word "covers" add -- the --.

Signed and Sealed this

Sixteenth Day of October, 2001

Attest:

NICHOLAS P. GODICI
Attesting Officer
Acting Director of the United States Patent and Trademark Office